United States Patent
Yano

(10) Patent No.: US 9,231,364 B2
(45) Date of Patent: Jan. 5, 2016

(54) LASER APPARATUS

(71) Applicant: MITUTOYO CORPORATION, Kanagawa (JP)

(72) Inventor: Ryunosuke Yano, Miyazaki (JP)

(73) Assignee: MITUTOYO CORPORATION, Kanagawa (JP)

( * ) Notice: Subject to any disclaimer, the term of this patent is extended or adjusted under 35 U.S.C. 154(b) by 0 days.

(21) Appl. No.: 14/263,205

(22) Filed: Apr. 28, 2014

(65) Prior Publication Data

US 2014/0328359 A1    Nov. 6, 2014

(30) Foreign Application Priority Data

May 2, 2013    (JP) .................................. 2013-097020

(51) Int. Cl.
| | |
|---|---|
| H01S 3/13 | (2006.01) |
| H01S 3/139 | (2006.01) |
| H01S 3/109 | (2006.01) |
| H01S 3/131 | (2006.01) |
| H01S 3/08 | (2006.01) |
| H01S 3/0941 | (2006.01) |

(Continued)

(52) U.S. Cl.
CPC .............. *H01S 3/1305* (2013.01); *H01S 3/109* (2013.01); *H01S 3/1312* (2013.01); *H01S 3/1392* (2013.01); *H01S 3/025* (2013.01); *H01S 3/08027* (2013.01); *H01S 3/09415* (2013.01); *H01S 3/1611* (2013.01); *H01S 3/1673* (2013.01); *H01S 5/06213* (2013.01); *H01S 5/06804* (2013.01)

(58) Field of Classification Search
CPC ............................. H01S 3/1305; H01S 3/1392

USPC .................................................... 372/29.011
See application file for complete search history.

(56) References Cited

U.S. PATENT DOCUMENTS 7,065,012 B2 *   6/2006   Masaki .................... 369/44.29
7,613,216 B2 *  11/2009   Nakagawa ................... 372/32

(Continued)

FOREIGN PATENT DOCUMENTS

| EP | 1744414 | 1/2007 |
|---|---|---|
| EP | 2058907 | 5/2009 |

(Continued)

OTHER PUBLICATIONS

Jun Ishikawa, "Portable national length standards desired and constructed using commercially available parts", Synthesiology, Nov. 2009, pp. 276-287.

(Continued)

*Primary Examiner* — Xinning Niu
*Assistant Examiner* — Vu A Vu
(74) *Attorney, Agent, or Firm* — Greenblum & Bernstein, P.L.C.

(57) ABSTRACT

A laser light generator emits laser light, a frequency of which can be adjusted. A laser light detector bombards an iodine cell with the laser light and photoelectrically converts the laser light that has passed through the iodine cell, then outputs a light output signal. A third order differential lock-in amplifier generates a third order differential signal of the light output signal. A frequency locker causes the laser light generator to change the frequency of the laser light within a predetermined range, detects an amplitude corresponding to a saturated absorption line occurring in the third order differential signal, and causes the frequency of the laser light to stabilize to a predetermined value. An error detector outputs an error signal in a case where the amplitude corresponding to the saturated absorption line occurring in the third order differential signal is greater than a predetermined value.

10 Claims, 12 Drawing Sheets

(51) Int. Cl.
  *H01S 3/16* (2006.01)
  *H01S 5/062* (2006.01)
  *H01S 5/068* (2006.01)
  *H01S 3/02* (2006.01)

(56) References Cited

U.S. PATENT DOCUMENTS 7,835,411 B2  11/2010  Masuda et al.
2013/0195132 A1  8/2013  Yano et al.

FOREIGN PATENT DOCUMENTS

| EP | 2101378 | 9/2009 |
| EP | 2575219 | 4/2013 |
| JP | 2008-130848 | 6/2008 |
| JP | A-2008-130848 | 6/2008 |

OTHER PUBLICATIONS

Search report from E.P.O., mail date is Oct. 7, 2014.

* cited by examiner

LASER APPARATUS

CROSS-REFERENCE TO RELATED APPLICATIONS

The present application claims priority under 35 U.S.C. §119 of Japanese Application No. 2013-097020, filed on May 2, 2013, the disclosure of which is expressly incorporated by reference herein in its entirety.

BACKGROUND OF THE INVENTION

1. Field of the Invention

The present invention relates to a laser apparatus.

2. Description of Related Art

A wavelength of a solid laser is used as a standard for length, the wavelength of the solid laser being in a 532 nm region in continuous-wave oscillation using a Nd:YAG crystal excited by a semiconductor laser, for example, as a gain medium. In effect, in order to perform length measurement using the wavelength of a laser light, the laser light must oscillate at a single frequency, i.e., at a single longitudinal mode. Moreover, in order to stabilize the frequency of the laser light using a spectroscopic technique for atom or molecule absorption lines, it must be possible to select an oscillation frequency as desired. For example, in an iodine stabilized laser using a spectroscopic technique for iodine molecule absorption lines, a laser light with a high degree of frequency stability can be obtained by controlling an oscillation frequency to a center of a saturated absorption signal (Japanese Patent Laid-open Publication No. 2008-130848).

A principle of frequency search using a differential signal of a light output signal that contains a saturated absorption signal of an iodine molecule is already known (Ishikawa, Jun, "Portable national length standards designed and constructed using commercially available parts," Synthesiology, National Institute of Advanced Industrial Science and Technology, November 2009, Vol. 2, No. 4, pp. 276-287).

However, the inventor of the present invention has discovered an issue, discussed below, with respect to the above-noted technique. In the above-noted technique, a drive current is monitored and degradation of the laser over time is detected. However, the laser apparatus may be exposed to an external disturbance such as vibration from a surrounding operating environment. For a laser apparatus for which a high degree of frequency stability is demanded, exposure to an external disturbance may give rise to an event where the frequency of laser light temporarily deviates from a predetermined frequency and the laser apparatus can no longer meet the required level of frequency stability. For example, when the laser light is used for length measurement or the like in a state where the required level of frequency stability cannot be met, reliable measurement results cannot be obtained. Accordingly, detection of an event where the frequency of the laser light temporarily deviates from the predetermined frequency is desired. However, the above-noted technique merely monitors the drive current of the laser, and therefore detection of an event where the frequency of the laser light temporarily deviates from the predetermined frequency is not possible.

SUMMARY OF THE INVENTION

The present disclosure was conceived in light of the above-noted circumstances and has as an advantage that an event where a frequency of laser light temporarily deviates from a predetermined frequency due to an external disturbance, for example, is detected in a laser apparatus.

A laser apparatus according to one aspect of the present disclosure includes a laser light generator, a laser light detector, a differential signal generator, a frequency locker, and an error detector. The laser light generator emits laser light, a frequency of which can be adjusted. The laser light detector bombards an iodine cell with the laser light and photoelectrically converts the laser light that has passed through the iodine cell, then outputs a first light output signal. The differential signal generator generates a differential signal of the first light output signal. The frequency locker causes the laser light generator to change the frequency of the laser light within a predetermined range, detects an amplitude corresponding to a saturated absorption line occurring in the differential signal, and causes the frequency of the laser light to stabilize to a predetermined value. The error detector outputs a first error signal in a case where the amplitude corresponding to the saturated absorption line occurring in the differential signal is greater than a predetermined value. Thereby, an event where the frequency of the laser light emitted by the laser apparatus temporarily deviates from a predetermined frequency due to an external disturbance, for example, can be detected.

The laser apparatus according to another aspect of the present disclosure is the above-noted laser apparatus, which further includes a drive status controller controlling initiation and suspension of frequency stabilizing control of the laser light by the frequency locker in response to an input drive status control signal. Thereby, an event where the frequency of the laser light emitted by the laser apparatus temporarily deviates from the predetermined frequency due to an external disturbance, for example, can be detected.

The laser apparatus according to another aspect of the present disclosure is the above-noted laser apparatus, which further includes a suspension determiner outputting the drive status control signal to the drive status controller in a case where the first error signal has been output, the drive status control signal being output so as to suspend the frequency stabilizing control of the laser light by the frequency locker. Thereby, in a case where the frequency of the laser light emitted by the laser apparatus temporarily deviates from the predetermined frequency due to an external disturbance, for example, emission of the laser light can be automatically suspended.

The laser apparatus according to another aspect of the present disclosure is the above-noted laser apparatus, which further includes a laser drive controller controlling an optical intensity of the laser light emitted from the laser light generator in response to a second light output signal. The laser light detector photoelectrically converts the laser light and outputs the second light output signal. The drive status controller controls initiation and suspension of optical intensity control of the laser light by the laser drive controller in response to the drive status control signal. Thereby, the optical intensity of the laser light emitted from the laser light generator can be adjusted.

The laser apparatus according to another aspect of the present disclosure is the above-noted laser apparatus, in which the laser light generator includes a laser as a light source, and the laser drive controller supplies drive current to the laser based on the second light output signal. Thereby, the optical intensity of the laser light emitted from the laser light generator can be adjusted.

The laser apparatus according to another aspect of the present disclosure is the above-noted laser apparatus, in which the error detector outputs a second error signal in a case where the drive current is greater than a predetermined value. Thereby, a defective status requiring maintenance or part replacement can be detected, such as when the light source of the laser apparatus deteriorates over time.

The laser apparatus according to another aspect of the present disclosure is the above-noted laser apparatus, in which the suspension determiner outputs the drive status control signal to the drive status controller in a case where the second error signal has been output, the drive status control signal being output so as to suspend the frequency stabilizing control of the laser light by the frequency locker and suspend the optical intensity control of the laser light by the laser drive controller. Thereby, when a defective status arises requiring maintenance or part replacement, such as when the light source of the laser apparatus deteriorates over time, emission of the laser light can be automatically suspended.

The laser apparatus according to another aspect of the present disclosure is the above-noted laser apparatus, in which the suspension determiner outputs the drive status control signal to the drive status controller in a case where the first error signal and the second error signal have not been output due to a reset, the drive status control signal being output so as to initiate the frequency stabilizing control of the laser light by the frequency locker and initiate the optical intensity control of the laser light by the laser drive controller. Thereby, after emission of the laser light has been suspended, emission of the laser light can be reinitiated once the defective status is resolved.

The laser apparatus according to another aspect of the present disclosure is the above-noted laser apparatus, which further includes an error resetter executing a reset operation causing the error detector to reset the first error signal in a case where the first error signal has been input and an error reset denial signal has not been input. Thereby, after emission of the laser light has been suspended, emission of the laser light can be automatically reinitiated once the defective status is resolved.

The laser apparatus according to another aspect of the present disclosure is the above-noted laser apparatus, in which the error resetter does not execute the reset operation in a case where the first error signal is output from the error detector after the reset operation has been performed a predetermined number of times. Thereby, unnecessary repetition of the reset operation can be prevented in a case where the defective status unexpectedly continues.

According to the present disclosure, an event where a frequency of laser light temporarily deviates from a predetermined frequency due to an external disturbance, for example, can be detected in a laser apparatus.

The present disclosure is clarified by the following detailed description and the appended drawings. The appended drawings are referenced only to facilitate understanding and do not serve to limit the present invention.

BRIEF DESCRIPTION OF THE DRAWINGS

The present disclosure is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE INVENTION

Figure 1:
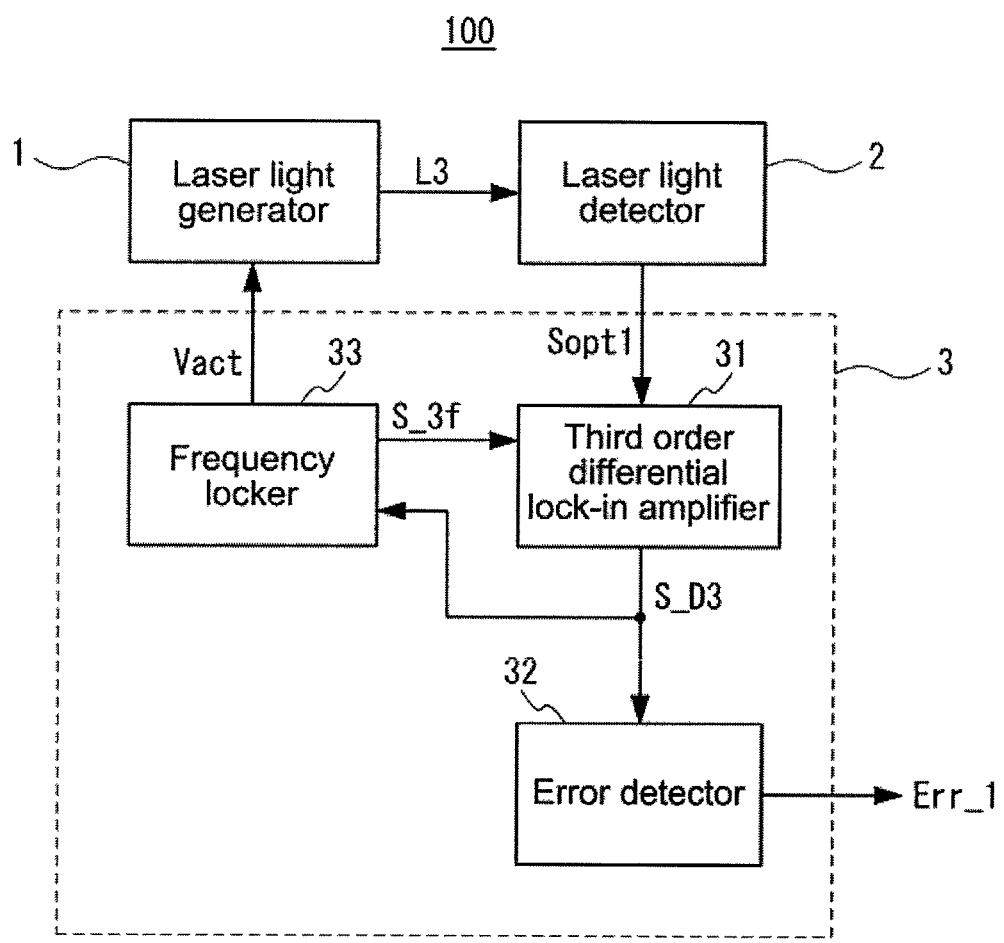
FIG. 1 is a block diagram schematically illustrating a basic configuration of a laser apparatus 100 according to a first embodiment.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the forms of the present invention may be embodied in practice.

Hereafter, embodiments of the present invention are described with reference to the drawings. Identical reference numerals are assigned to identical elements in each of the plurality of drawings, and duplicative descriptions are omitted where necessary.

First Embodiment

A description is given of a laser apparatus 100 according to a first embodiment. The laser apparatus 100 is configured as a laser apparatus having a frequency stabilizing effect capable of stabilizing a frequency of oscillating laser light to a predetermined value. In addition, the laser apparatus 100 has a configuration performing an operation to detect a state where frequency stabilization is impossible, the operation detecting an event in which the frequency of the laser light temporarily deviates from the predetermined value due to an external disturbance or the like.

As shown in FIG. 1, the laser apparatus 100 includes a laser light generator 1, a laser light detector 2, and a drive controller 3.

Figure 3:
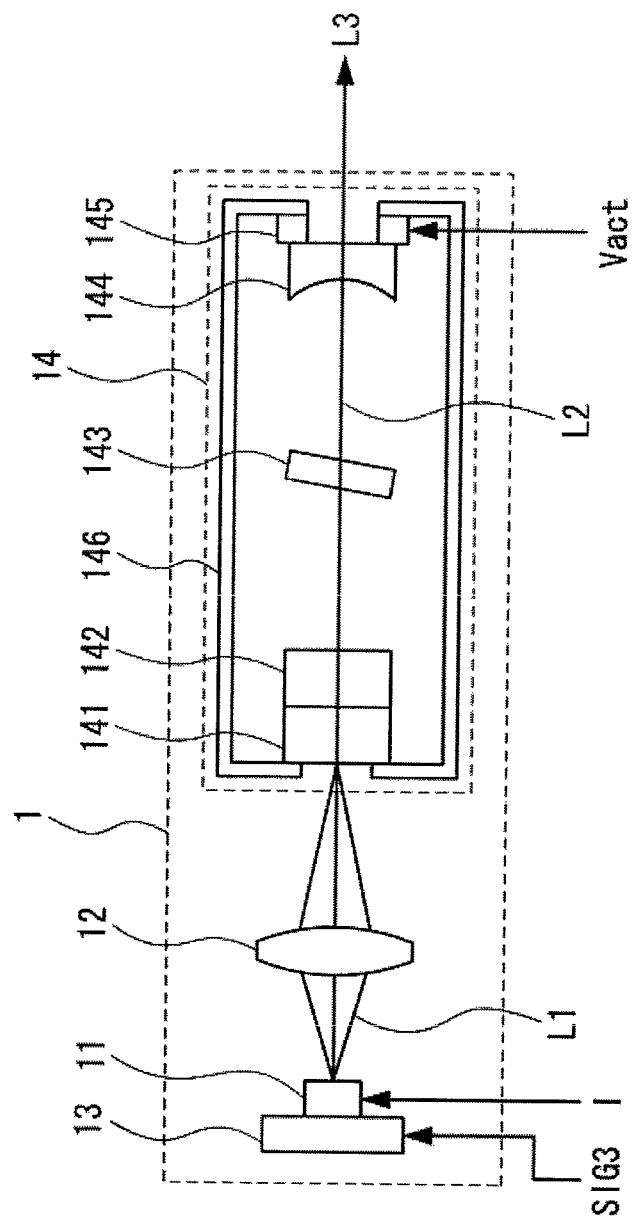
FIG. 3 is a structural diagram schematically illustrating a configuration of a laser light generator 1.

The laser light generator 1 has a configuration emitting laser light L3 that is modulated based on a modulated signal of frequency 1 f (Hz). The laser light L3 includes, for example, 1064 nm-wavelength light and 532 nm-wavelength light, which is a second harmonic wave of the 1064 nm-wavelength light. As shown in FIG. 3, the laser light generator 1 includes a semiconductor laser 11, a light collection optical system 12, a semiconductor laser heater/cooler 13, and a laser light resonator 14.

By inputting a drive current, the semiconductor laser 11 emits an 808 nm-wavelength laser light L1. The laser light L1 emitted from the semiconductor laser 11 is collected by the light collection optical system 12, after which the laser light L1 is optically guided to the laser light resonator 14. Moreover, the light collection optical system 12 may be configured by a single optical member or by a plurality of optical members. The semiconductor laser heater/cooler 13 is provided proximate to or in contact with the semiconductor laser 11 and heats or cools the semiconductor laser 11 in response to a control signal SIG3.

The laser light resonator 14 includes a Nd:YVO$_4$ crystal 141, a KTP crystal 142, an etalon 143, a reflecting mirror 144, an actuator 145, and a resonator housing 146. The Nd:YVO$_4$ crystal 141, the KTP crystal 142, the etalon 143, the reflecting mirror 144, and the actuator 145 are accommodated within the resonator housing 146.

The YVO$_4$ crystal 141 and the KTP crystal 142 are arranged in that order on a side where the laser light L1 is incident. For example, the Nd:YVO$_4$ crystal 141 and the KTP crystal 142 are each attached to brass holders (not shown in the drawings) having a comparatively large linear expansion coefficient.

In the YVO$_4$ crystal 141, Nd (neodymium) atoms are excited by bombardment with the laser light L1 to emit 1064 nm-wavelength light via stimulated emission. In addition, a coating (not shown in the drawings) reflecting 1064 nm-wavelength light is applied to a surface of the Nd:YVO$_4$ crystal 141 on a side from which the laser light L1 bombards the crystal.

The KTP crystal 142 is a nonlinear optical crystal and converts a portion of the 1064 nm-wavelength light caused by stimulated emission into 532 nm-wavelength light, which is a second harmonic wave. Herein, when the 1064 nm-wavelength light has a single longitudinal mode, the second harmonic wave 532 nm-wavelength light also has a single longitudinal mode.

The etalon 143 is positioned in a center of the laser light resonator 14. The etalon 143 is characterized by only transmitting a specific frequency of laser light.

The reflecting mirror 144 and the actuator 145 are positioned on a laser light emission side of the laser light resonator 14.

The reflecting mirror 144 has a coating which reflects 1064 nm-wavelength light and transmits 532 nm-wavelength light. Accordingly, in the laser light resonator 14, the Nd:YVO$_4$ crystal 141 and the reflecting mirror 144 configure a light resonator for 1064 nm-wavelength light.

The actuator 145 is a piezo element which is capable of deforming with an application of voltage and changing a position of the reflecting mirror 144.

Due to the configuration of the laser light resonator 14 described above, light transmitted through the Nd:YVO$_4$ crystal 141 and the KTP crystal 142 becomes the laser light L2, which includes wavelengths of 532 nm, 808 nm, and 1064 nm. In addition, the 1064 nm-wavelength and 532 nm-wavelength single longitudinal mode laser light L3 is obtained by selecting the amplification and wavelength of the laser light L2 with the laser light resonator 14.

Furthermore, in a case where an antireflective coating is applied to a surface of the Nd:YVO$_4$ crystal 141 on the KTP crystal 142 side and to both surfaces of the KTP crystal 142, the coating acts as a frequency filter. Accordingly, only light of a specific frequency will pass through the coating.

The laser light detector 2 detects intensity of the 532 nm-wavelength light from the laser light L3, then outputs light output signals Sopt1 and Sopt2 according to detection results.

The laser light detector 2 allows the 532 nm-wavelength light contained in the laser light L3 to pass through the iodine cell and outputs, as the light output signal Sopt1, a signal in which the transmitted light is photoelectrically converted. In addition, the laser light detector 2 can also output a photoelectrically converted signal as the light output signal Sopt2 without allowing the 532 nm-wavelength laser light contained in the laser light L3 to pass through the iodine cell.

Figure 4:
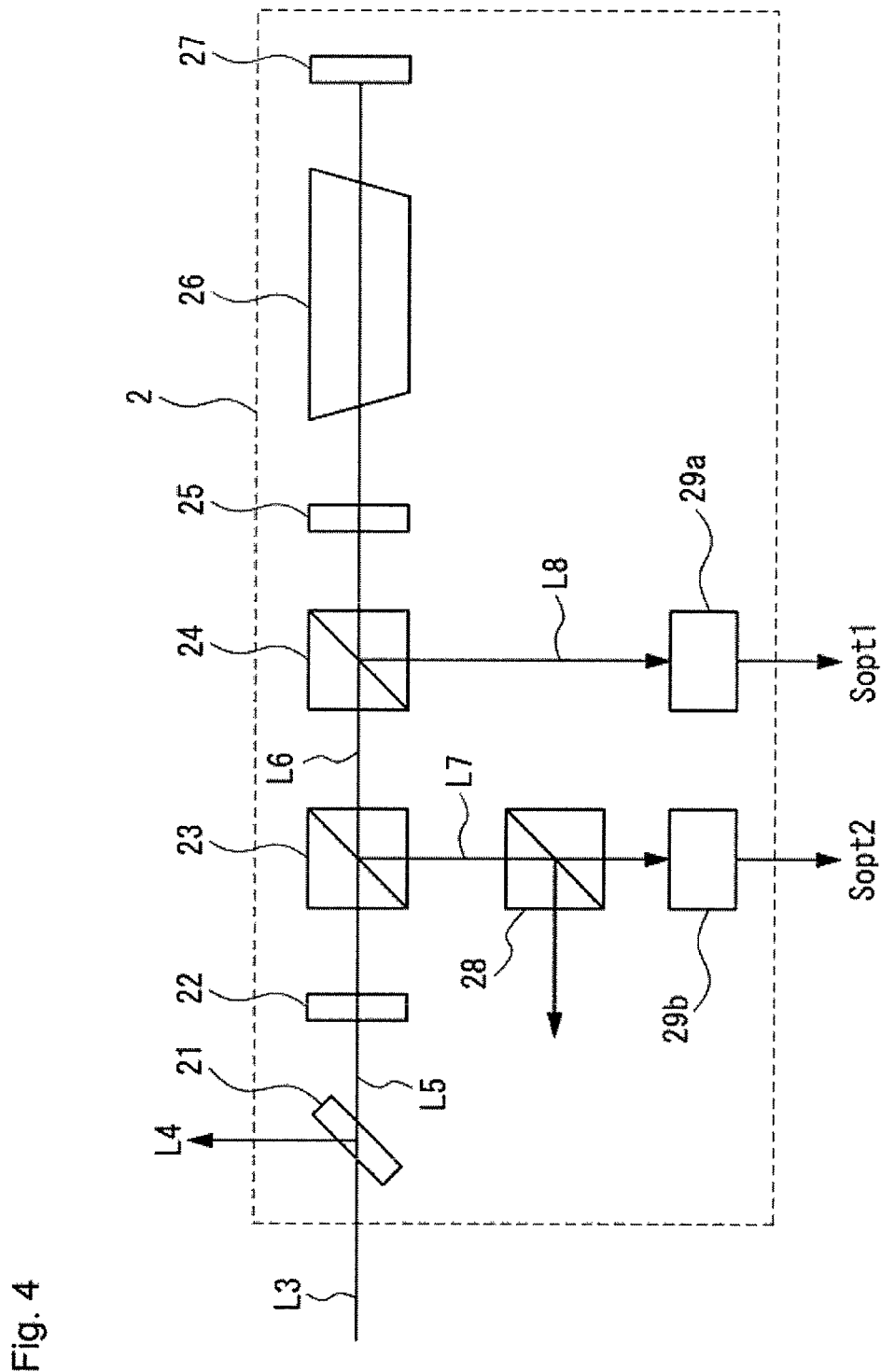
FIG. 4 is a structural diagram schematically illustrating a configuration of a laser light detector 2.

As shown in FIG. 4, the laser light detector 2 includes a harmonics separator 21, a polarizing plate 22, a polarizing beam splitter 23, a polarizing beam splitter 24, a λ/4 plate (i.e., a quarter-wave plate) 25, an iodine cell 26, a reflecting plate 27, a beam splitter 28, a first light detector 29a, and a second light detector 29b.

The harmonics separator 21 splits the laser light L3 containing 1064 nm and 532 nm wavelengths into a 1064 nm-wavelength laser light L4 and a 532 nm-wavelength laser light L5.

The 532 nm-wavelength laser light L5 is polarized by the polarizing plate 22. Light of p polarized light passes through the polarizing beam splitter 23 to become laser light L6 and light of s polarized light is reflected by the polarizing beam splitter 23 to become laser light L7.

Thereafter, the laser light L6 passes through the polarizing beam splitter 24, the quarter-wave plate 25, and the iodine cell 26, then is reflected by the reflecting plate 27. The reflected light passes through the iodine cell 26 and the quarter-wave plate 25 once again. Specifically, a specific wavelength of the laser light L6 (p polarized light) is absorbed by the iodine cell 26, is polarized from p polarized light to s polarized light by passing through the quarter-wave plate 25 twice, and becomes laser light L8. The laser light L8 is reflected by the polarizing beam splitter 24 and strikes the first light detector 29a. The first light detector 29a outputs, as the light output signal Sopt1, a photoelectric conversion result of the laser light L8.

Meanwhile, the laser light L7 (s polarized light) is split into two branches by the beam splitter 28. A first branch of the laser light L7 strikes the second light detector 29b. The second light detector 29b outputs, as the light output signal Sopt2, results of a photoelectric conversion of the laser light L7. In addition, a second branch of the laser light L7 is emitted to an exterior as emitted laser light of the laser apparatus 100 and is used in length measurement and the like.

Figure 2:
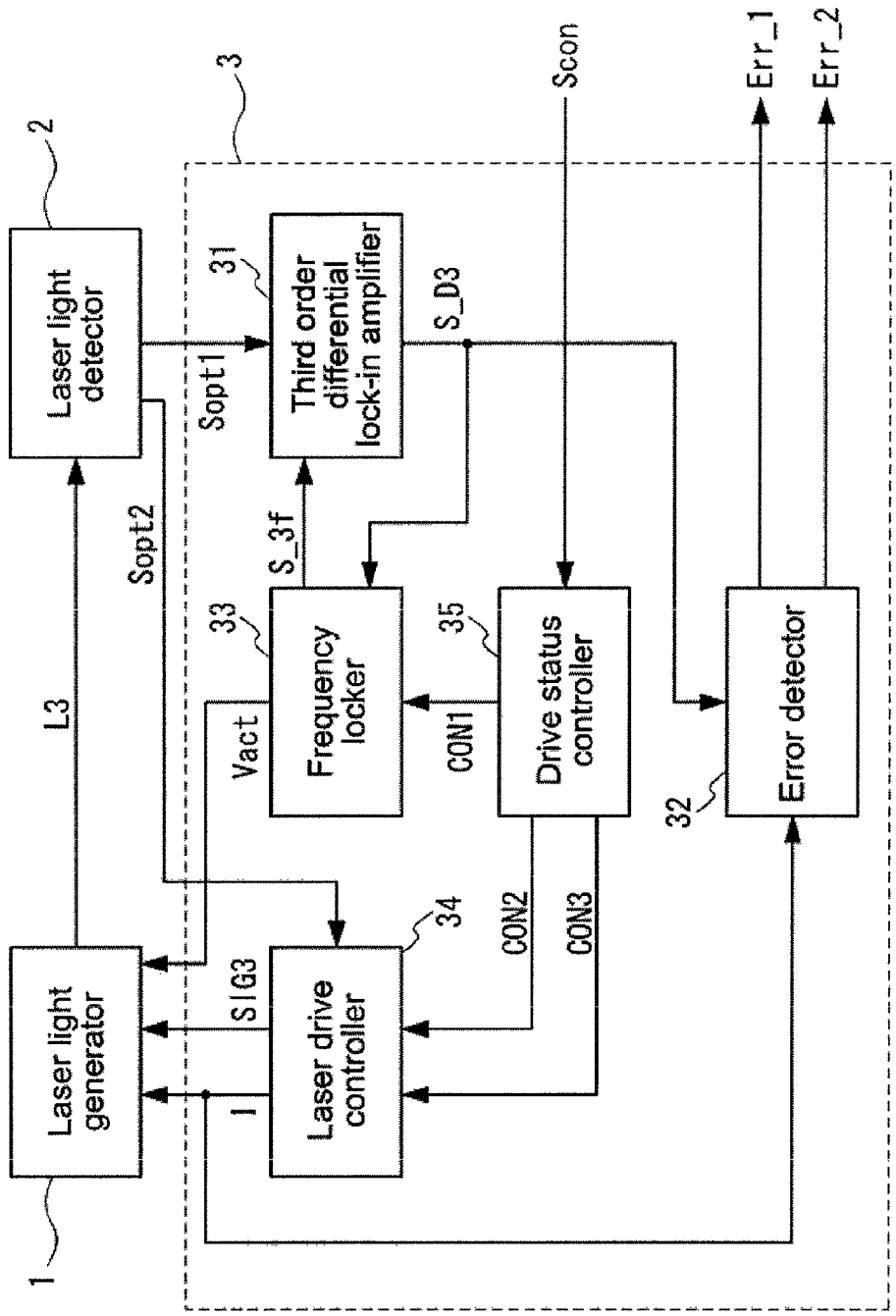
FIG. 2 is a block diagram illustrating further details of a configuration of the laser apparatus 100 according to the first embodiment.

As shown in FIG. 2, the drive controller 3 outputs an error signal in response to a fluctuation in signal level of a third order differential signal S_D3 for the light output signal Sopt1. The drive controller 3 includes a third order differential lock-in amplifier 31, an error detector 32, the frequency locker 33, the laser drive controller 34, and a drive status controller 35.

The third order differential lock-in amplifier 31 generates the third order differential signal S_D3 for the light output signal Sopt1. The light output signal Sopt1 is demodulated by a modulated signal S_3f of frequency 3 f (Hz), and the third order differential signal S_D3 is generated. The third order differential lock-in amplifier 31 outputs the generated third order differential signal S_D3 to the error detector 32 and the frequency locker 33. Moreover, the modulated signal S_3f of frequency 3 f (Hz) may be generated on an interior of the third order differential lock-in amplifier 31, or may be supplied from the exterior. In the embodiment that follows, the modulated signal S_3f of frequency 3 f (Hz) is described as being supplied from a modulation/demodulation signal generator 331 of the frequency locker 33.

The error detector 32 monitors the third order differential signal S_D3 and, in a case where the signal level (voltage) of the third order differential signal S_D3 is equal to or greater than a threshold value Vth, the error detector 32 outputs an error signal Err_1.

When the frequency of the laser light L2 emitted from the laser light generator 1 is modified within a certain range, the frequency locker 33 detects an amplitude appearing in the third order differential signal S_D3 and corresponding to a saturated absorption line of the iodine cell, described above. Also, the frequency locker 33 controls the laser light generator 1 using an actuator drive voltage Vact and stabilizes the frequency of the laser light emitted by the laser light generator 1 to a predetermined value, such that the third order differential signal S_D3 maintains a zero coordinate.

Figure 5:
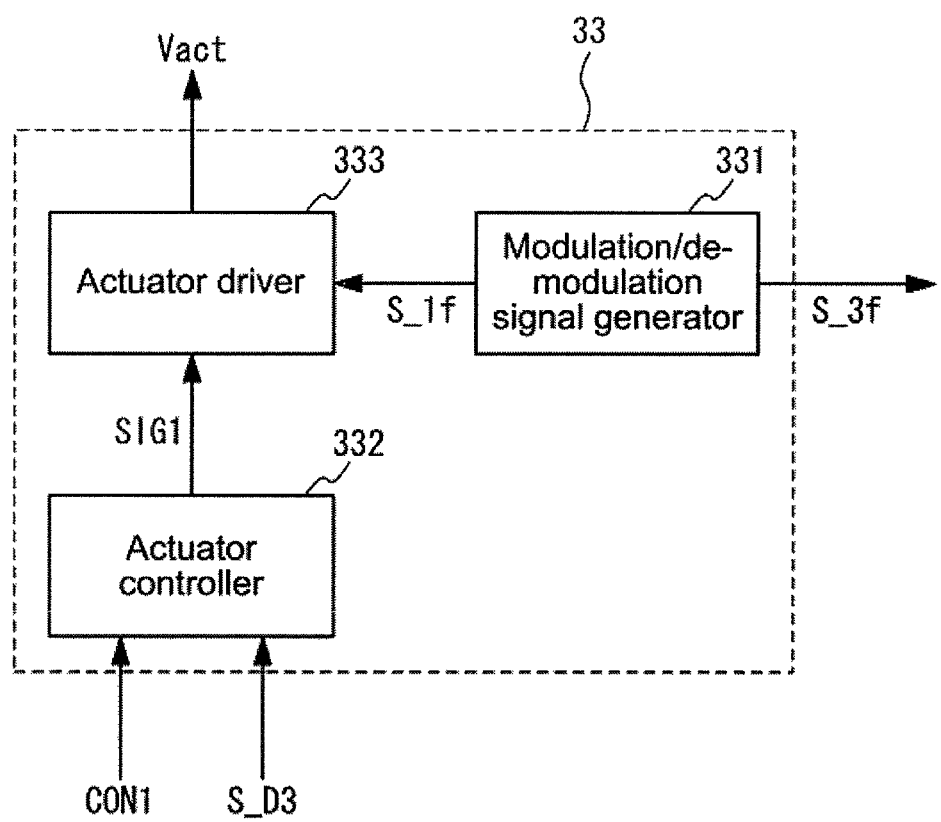
FIG. 5 is a block diagram schematically illustrating an exemplary configuration of a frequency locker 33.

As shown in FIG. 5, the frequency locker 33 includes the modulation/demodulation signal generator 331, an actuator controller 332, and an actuator driver 333.

The modulation/demodulation signal generator 331 outputs a modulation signal S_1f of frequency 1 f (Hz) to the actuator driver 333, and outputs a modulation signal S_3f of frequency 3 f (Hz) to the third order differential lock-in amplifier 31.

The third order differential signal S_D3 is supplied to the actuator controller 332 from the third order differential lock-in amplifier 31. The actuator controller 332 outputs a control signal SIG1 (control signal for generating actuator drive voltage) to the actuator driver 333 such that the third order differential signal S_D3 maintains a zero coordinate. The actuator controller 332 also performs control such that the frequency of the laser light is stabilized at a predetermined value. In addition, the frequency stabilizing control by the actuator controller 332 is controlled by an operation signal CON1 (operation signal for controlling actuator drive) from the drive status controller 35. Moreover, the actuator controller 332 can be embodied, for example, by a computer configured by a memory storing a program and a CPU executing the program.

Based on the control signal SIG1, the actuator driver 333 outputs the actuator drive voltage Vact to the actuator 145 and modulates the laser light L3, the actuator drive voltage Vact having been modulated by the modulation signal of frequency 1 f (Hz) input from the modulation/demodulation signal generator 331. Specifically, the actuator controller 332 controls an oscillation frequency of the laser light L3 and stabilizes the frequency to a predetermined value by causing the actuator drive voltage Vact to be output from the actuator driver 333 to the actuator 145.

Figure 6:
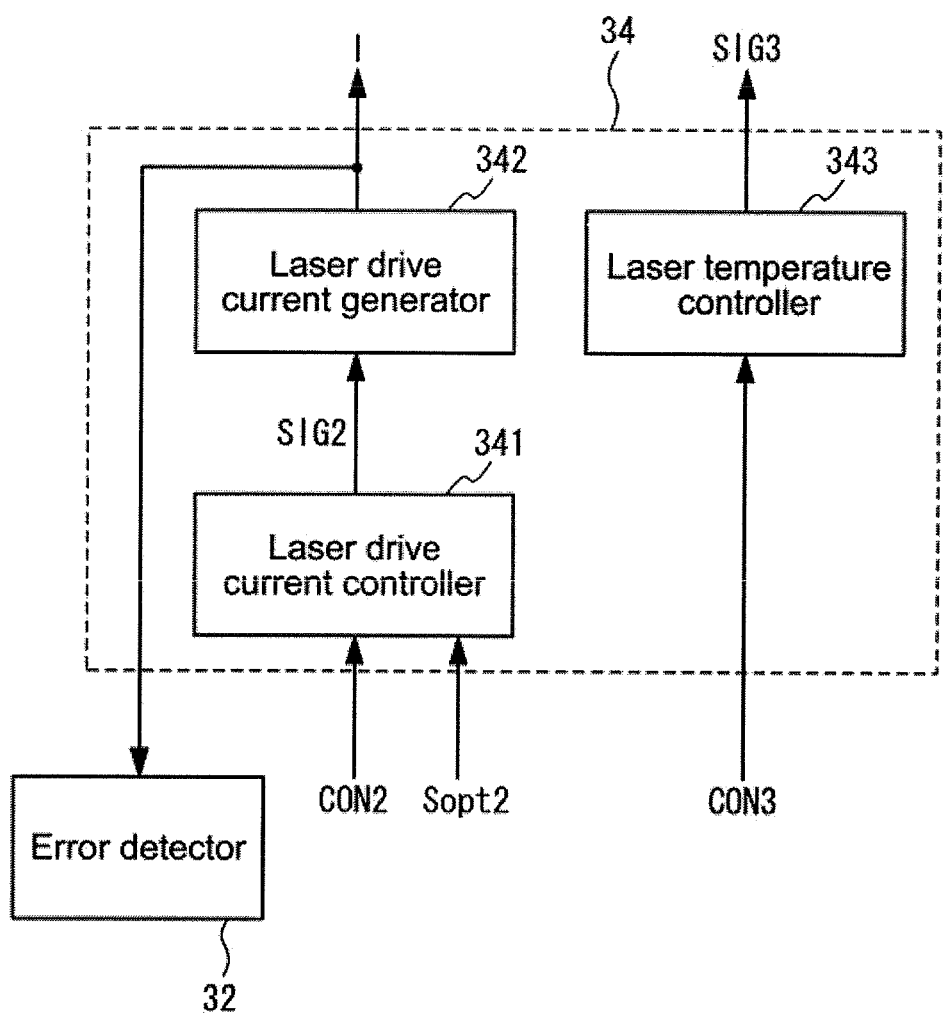
FIG. 6 is a block diagram schematically illustrating an exemplary configuration of a laser drive controller 34.

The laser drive controller 34 controls the semiconductor laser 11 and the semiconductor laser heater/cooler 13. As shown in FIG. 6, the laser drive controller 34 includes a laser drive current controller 341, a laser drive current generator 342, and a laser temperature controller 343.

Based on the light output signal Sopt2, the laser drive current controller 341 outputs a control signal SIG2 for causing the laser drive current generator 342 to generate drive current (control signal for generating laser drive current). Thereby, a laser drive current I supplied to the semiconductor laser 11 is controlled. In addition, the laser drive current control by the laser drive current controller 341 is controlled by an operation signal CON2 (operation signal for controlling the laser drive current) from the drive status controller 35.

The laser drive current generator 342 supplies the laser drive current I to the semiconductor laser 11 based on the control signal SIG2 to generate the laser light L1. In addition, the error detector 32 described above references the laser drive current I and, in a case where the laser drive current I has exceeded a predefined value, the error detector 32 can also output an error signal Err_2.

The laser temperature controller 343 outputs the control signal SIG3 for controlling the temperature of the semiconductor laser 11 using the semiconductor laser heater/cooler 13 (control signal for heating/cooling the semiconductor laser). Thereby, the temperature of the semiconductor laser 11 is controlled. The laser temperature control by the laser temperature controller 343 is controlled by an operation signal CON3 (operation signal for controlling the laser temperature) from the drive status controller 35.

The laser drive current controller 341 and the laser temperature controller 343 can be embodied, for example, by a computer configured by a memory storing a program and a CPU executing the program.

Using the operation signals CON1 to CON3, the drive status controller 35 controls initiation/suspension of laser drive current control, laser temperature control, and laser frequency stabilizing control in the laser apparatus 100 in response to a drive status control signal Scon input from the exterior.

A description is now given of detection of a status of the laser apparatus 100 where frequency stabilization is impossible. In the laser apparatus 100, in order to stabilize the laser oscillation frequency, frequency locking to keep the oscillation frequency constant is performed. In addition, the drive current supplied to the semiconductor laser can be monitored and degradation of the semiconductor laser over time can be detected (Japanese Patent Laid-open Publication No. 2008-130848). However, in the laser apparatus 100, a change in the signal level (voltage) of the third order differential signal S_D3 occurs due to the laser light generator 1 and the laser light detector 2 suffering an impact or the like from the exterior. In such a case, stabilization of the laser frequency, which is performed by referencing the third order differential signal S_D3, can no longer be performed normally.

Figure 7:
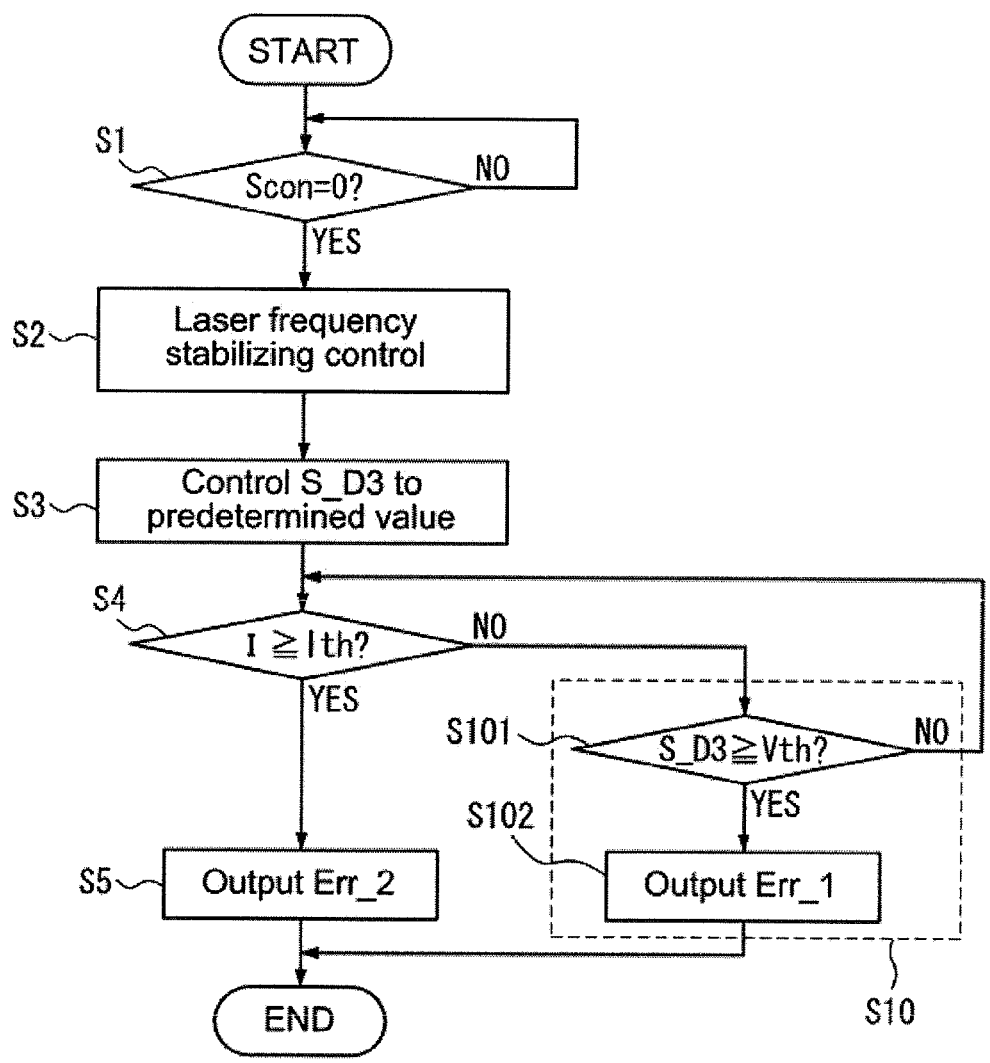
FIG. 7 is a flow chart illustrating operations of the laser apparatus 100 according to the first embodiment.

Therefore, in the laser apparatus 100, a status is detected where stabilization of the laser oscillation frequency is impossible due to a temporary fluctuation in the laser light frequency due to an impact or the like. FIG. 7 is a flow chart illustrating operations of the laser apparatus 100 according to the first embodiment.

Step S1

The drive status controller 35 confirms whether the drive status control signal Scon is "0."

Step S2

When the drive status control signal Scon is "0," the drive status controller 35 causes the laser drive current controller 341 to initiate the laser drive current control; causes the laser temperature controller 343 to initiate the laser temperature control; and causes the actuator controller 332 to initiate the laser frequency stabilizing control.

Step S3

The actuator controller 332 controls the actuator driver 333 such that the third order differential signal S_D3 is a predetermined value.

Step S4

The error detector 32 determines whether the laser drive current I is equal to or greater than a threshold value Ith.

Step S5

When the laser drive current I is equal to or greater than the threshold value Ith (I≥Ith), the error detector 32 outputs the error signal Err_2 and the process ends.

Step S10

When the laser drive current I is lower than the threshold value Ith (I<Ith), the process advances to step S101 in step S10 (operation to detect a status where frequency stabilization is impossible).

Step S101

The error detector 32 determines whether the third order differential signal S_D3 is equal to or greater than a threshold value Vth.

Step S102

When the third order differential signal S_D3 is equal to or greater than the threshold value Vth (S_D3≥Vth), the error detector 32 outputs the error signal Err_1.

As noted above, the error signal Err _1 is output in a case where the frequency of the laser light temporarily deviates from the predetermined value due to an external disturbance or the like. However, there are cases where, when a certain period of time has elapsed, an influence of the external disturbance dissipates and is resolved. Therefore, a defective status where the error signal Err_1 is output is referred to as a minor failure.

In addition, the error signal Err_2 is output in a case where the laser drive current I exceeds the threshold value Ith. This is due to deterioration of the semiconductor laser 11 over time, for example, and is a serious defect that requires maintenance such as replacement of parts. Therefore, a defective status where the error signal Err_2 is output is referred to as a major failure.

According to the present configuration, above, a status where frequency stabilization of the laser light is impossible due to an impact, for example, from the exterior can be detected while performing frequency stabilization with the laser apparatus 100. As a result, the present configuration also enables detection of a status where the frequency stabilization operation is impossible due to an external disturbance other than degradation of the laser apparatus 100 over time.

Second Embodiment

Figure 8:
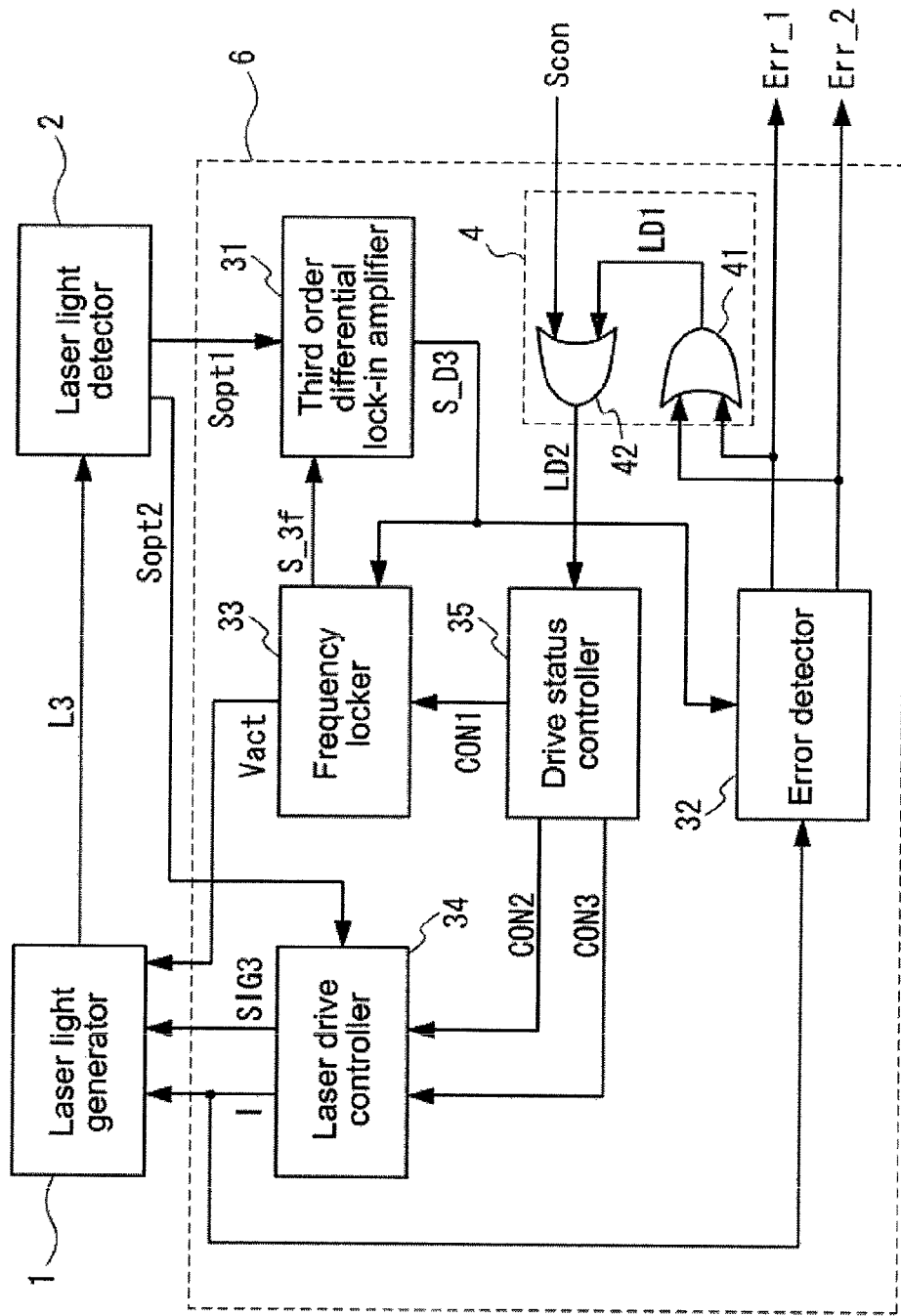
FIG. 8 is a block diagram schematically illustrating a configuration of a laser apparatus 200 according to a second embodiment.

A description is given of a laser apparatus 200 according to a second embodiment. As shown in FIG. 8, the laser apparatus 200 has a configuration in which the drive controller 3 of the laser apparatus 100 according to the first embodiment has been swapped for a drive controller 6. The drive controller 6 has a configuration in which a suspension determiner 4 is added to the drive controller 3.

The suspension determiner 4 includes OR circuits 41 and 42. The OR circuit 41 outputs a logical sum LD1 of the error signal Err_1 and the error signal Err_2. The OR circuit 42 outputs a logical sum LD2 of the logical sum LD1 (output by the OR circuit 41) and the drive status control signal Scon, and outputs the logical sum LD2 to the drive status controller 35 as the drive status control signal.

Figure 9:
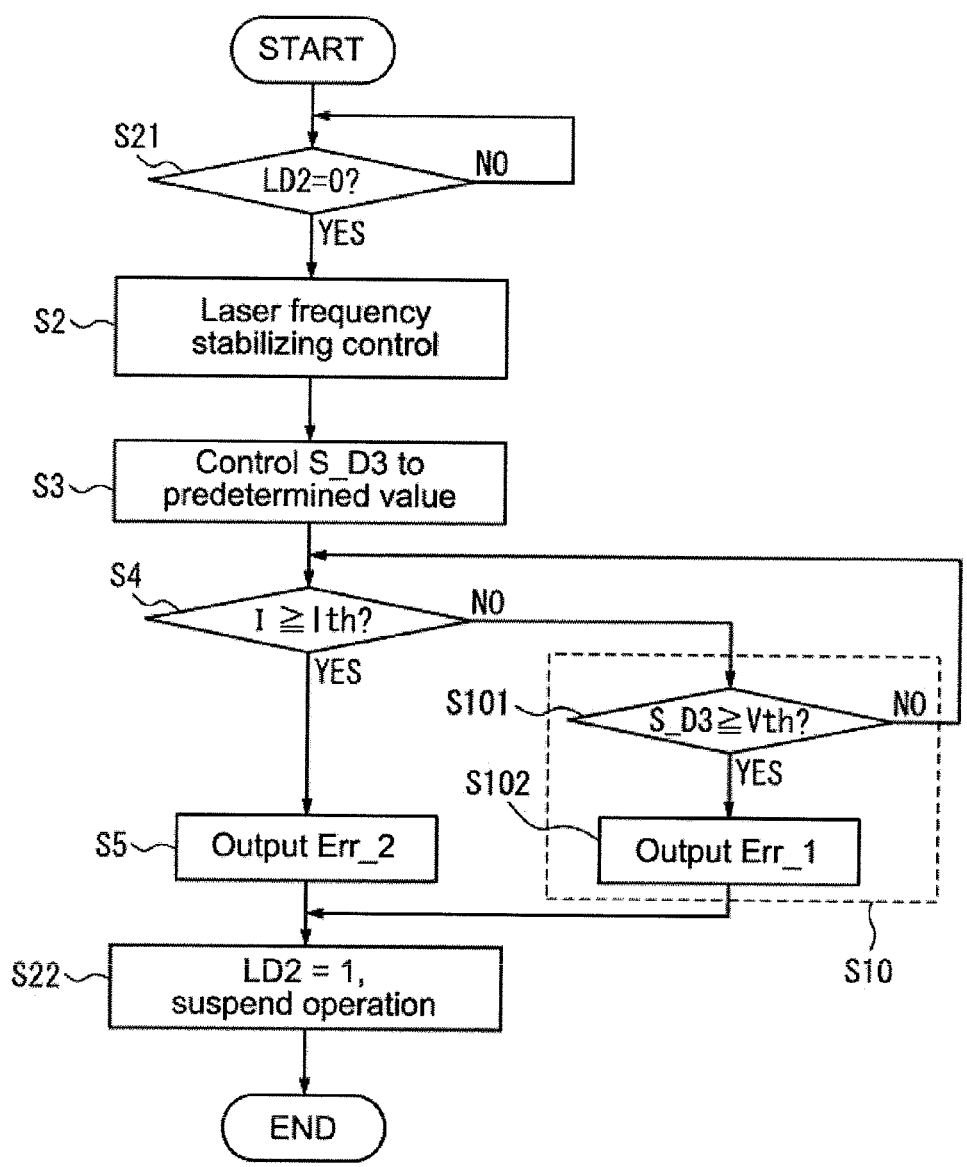
FIG. 9 is a flow chart illustrating operations of the laser apparatus 200 according to the second embodiment.

FIG. 9 is a flow chart illustrating operations of the laser apparatus 200 according to the second embodiment.

Step S21

The drive status controller 35 confirms whether the logical sum LD2 (the drive status control signal) is "0." At initiation of laser driving, the error detector 32 does not detect anomalies, and therefore the error signals Err_1 and Err_2 are both "0." Accordingly, when the drive status control signal Scon is "0," the logical sum LD2 is also "0" and the laser apparatus 200 initiates operations.

Steps S2 to S5 and S10

Steps S2 to S5 and S 10 are similar to FIG. 7 and descriptions thereof are therefore omitted.

Step S22

When one or both of the error signals Err_1 and Err 2 are "1," the OR circuit 41 outputs "1" as the logical sum LD1. Thus, the logical sum LD2 output by the OR circuit 42 is also "1." Accordingly, the drive status controller 35 suspends operations of the laser apparatus 200 due to the logical sum LD2 being "1." Specifically, laser drive current control in the laser drive current controller 341, laser temperature control in the laser temperature controller 343, and frequency stabilizing control in the actuator controller 332 are suspended. As a result, emission of the laser light L3 from the laser light generator 1 is suspended.

According to the present configuration, in a case where an anomaly is detected by the error detector 32, emission of the laser light from the laser light generator 1 can be automatically suspended. Thus, even in a case where frequency stabilization is impossible, a situation where the laser apparatus continues operating can be reliably prevented.

Moreover, the error signals Err_1 and Err_2 sent by the error detector 32 can be reset to "0," for example by sending a reset signal to the error detector 32 from the exterior.

Third Embodiment

Figure 10:
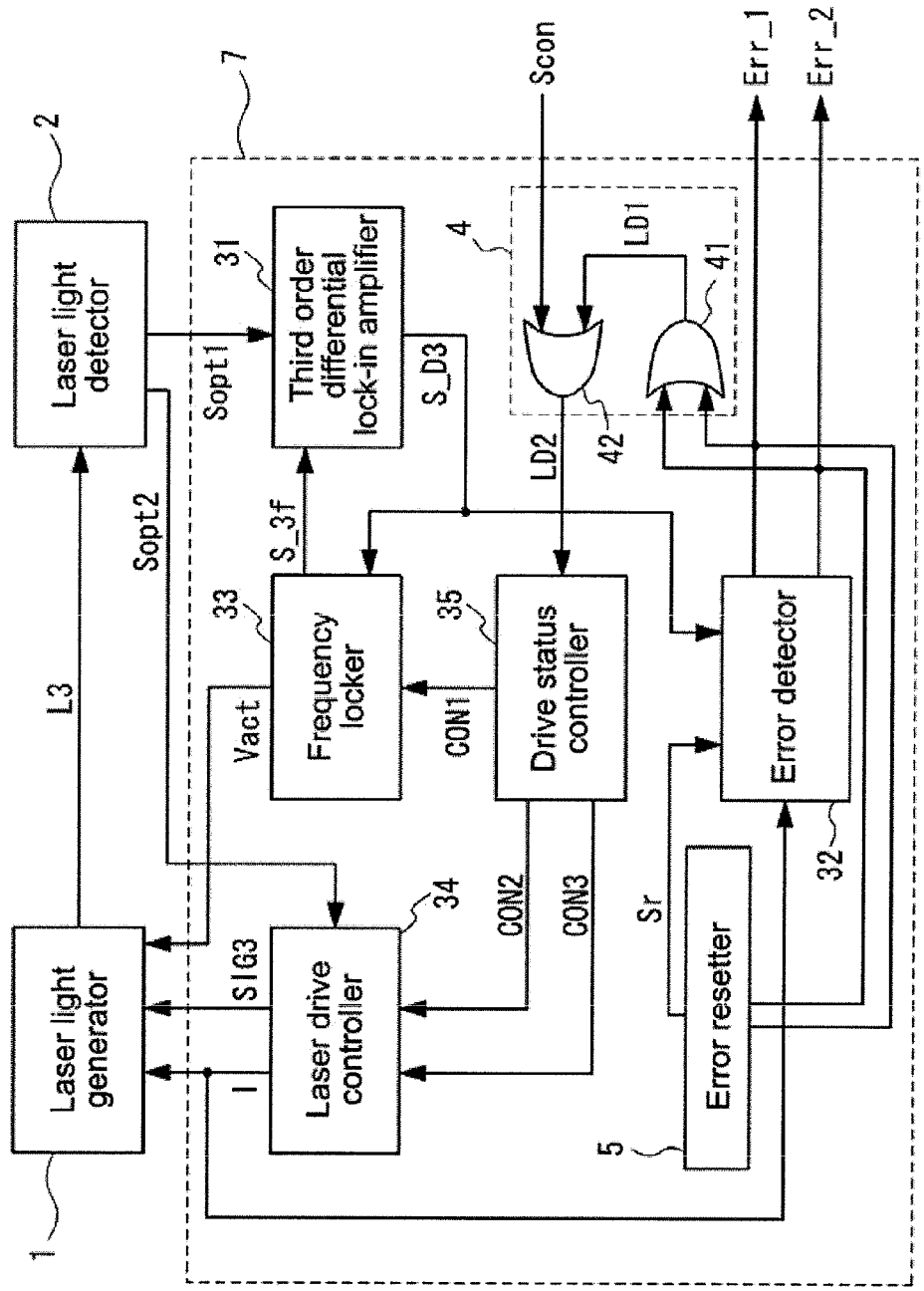
FIG. 10 is a block diagram schematically illustrating a configuration of a laser apparatus 300 according to a third embodiment.

A description is given of a laser apparatus 300 according to a third embodiment. As shown in FIG. 10, the laser apparatus 300 has a configuration in which the drive controller 6 of the laser apparatus 200 according to the second embodiment has been swapped for a drive controller 7. The drive controller 7 has a configuration in which an error resetter 5 is added to the drive controller 6.

Figure 11:
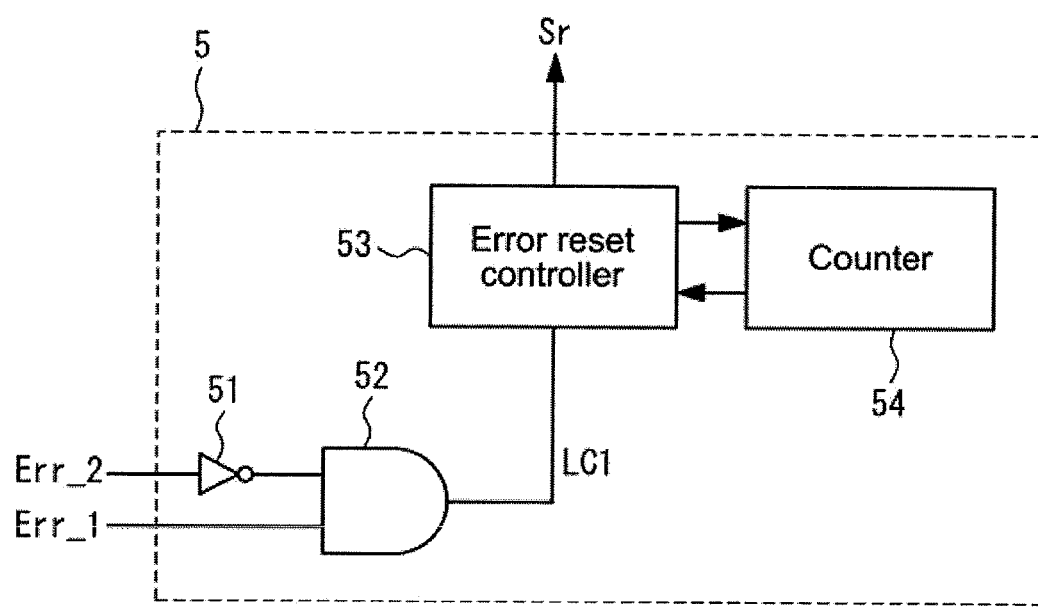
FIG. 11 is a block diagram schematically illustrating a configuration of an error resetter 5.

FIG. 11 is a block diagram schematically illustrating a configuration of the error resetter 5. The error resetter 5 includes a NOT circuit 51, an AND circuit 52, an error reset controller 53, and a counter 54.

The error signal Err_1 is input to a first input of the AND circuit 52 and an inverted signal of the error signal Err_2 is input to a second input via the NOT circuit 51. Thus, the AND circuit 52 outputs a logical product LC1 of the error signal Err_1 and the inverted signal of the error signal Err_2. Specifically, in a case where the error signal Err_1 is "0" and the error signal Err_2 is "1," "1" is output as the logical product LC1.

In response to a change in a value for the logical product LC1, the error reset controller 53 adds "1" to a count value N stored in the counter 54, or retrieves the count value N from the counter 54.

Figure 12:
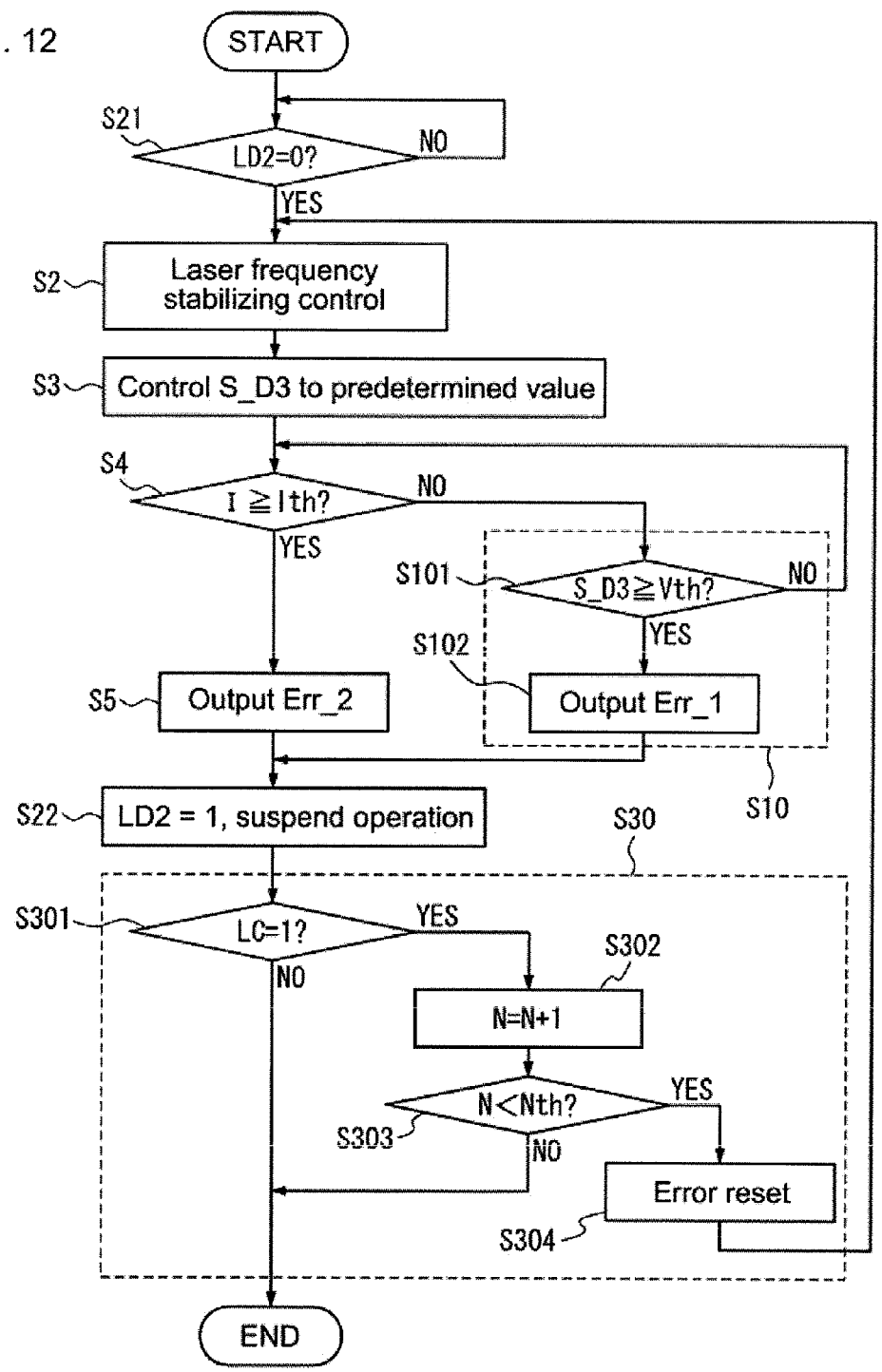
FIG. 12 is a flow chart illustrating operations of the laser apparatus 300 according to the third embodiment.

FIG. 12 is a flow chart illustrating operations of the laser apparatus 300 according to the third embodiment.

Steps S2 to S5, S10, S21 and S22

Steps S2 to S5, S10, S21, and S22 are similar to FIG. 9 and descriptions thereof are therefore omitted.

Step S30

A description of step S30 (error reset operation) is given.

Step S301

The error reset controller 53 determines whether the logical product LC1 output by the AND circuit 52 is "1." When the logical product LC1 is "0," the process ends there. Specifically, in a case where the error signal Err_2 is "1," the laser apparatus 300 maintains a state of suspension without performing the error reset operation.

Step S302

In a case where the logical product LC1 is "1," i.e., a case where the error signal Err_1 is "1" and the error signal Err_2 is "0," the error reset controller 53 adds "1" to the count value N (where N is an integer) of the counter 54. The count value N is defined in an initial state to be, for example, "0."

Step S303

The error reset controller 53 references the count value N of the counter 54 and determines whether the count value N is lower than an error reset limiting count Nth. In a case where the count value N is equal to or greater than the error reset limiting count Nth (N≥Nth), the process ends there. Specifically, in a case where the count value N is equal to or greater than the error reset limiting count Nth (N≥Nth), the laser apparatus 300 maintains a state of suspension without performing the error reset operation.

Step S304 In a case where the count value N is lower than the error reset limiting count Nth (N<Nth), the error reset controller 53 outputs an error reset signal Sr to the error detector 32 after a predetermined amount of time Δt has passed. Accordingly, the error detector 32 resets the error signals Err_1 and Err_2 to "0," which indicates that no error was detected. Thus, the operations of the laser apparatus 300 return to step S2. As a result, the laser apparatus 300 reinitiates laser emission.

According to the present configuration, the laser apparatus 300 can automatically reinitiate laser emission after the predetermined period of time Δt has passed only in a case where a minor failure occurs (indicated by the error signal Err_1).

In addition, as a result of looped processing from step S2 to step S30, in a case where the minor failure is not resolved at a point in time where error reset has been repeatedly performed within a range of the error reset limiting count Nth, the laser apparatus 300 can maintain a state of suspension without performing the error reset. Accordingly, in a case where a failure is not resolved in a short period of time despite being detected as a minor failure, operation of the laser apparatus can be suspended.

Moreover, in the present configuration, in a case where a major failure occurs (indicated by the error signal Err_2), the error reset operation is not performed regardless of whether there is a minor failure. Specifically, the error signal Err_2 can be understood to behave as an error reset denial signal. Accordingly, the laser apparatus can be reliably stopped in a case where a major failure has occurred and normal operation cannot be restored without repairs or changing parts.

Additional Embodiments

Moreover, the present invention is not limited to the embodiments described above, and may be modified as needed without departing from the scope of the present invention. For example, the configurations of the laser light generator 1 and the laser light detector 2 described above are merely exemplary and may have other appropriate configurations achieving a similar function.

In the above-described embodiments, the level of each signal was described as being either "1" or "0." However, this may also be understood as a state where a signal is output in a case where the signal level is "1," while a signal is not output in a case where the signal level is "0."

The wavelengths of light used in the above description are merely exemplary and a laser apparatus can of course be configured using any other appropriate wavelengths.

In the above, a case was described in which the third order differential signal is generated from the light output signal Sopt1. However, a second order differential signal or a fourth or higher order differential signal may also be generated for use. In addition, the order of the differential signal supplied to the frequency locker 33 and the order of the differential signal supplied to the error detector 32 may be the same or different.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A laser apparatus, comprising:
   a laser light generator configured to emit laser light, and further configured to adjust a frequency of the laser light;
   a laser light detector configured to bombard an iodine cell with the laser light, photoelectrically convert the laser light that has passed through the iodine cell, and then to output a first light output signal;
   a differential signal generator configured to generate a differential signal of the first light output signal;
   a frequency locker configured to control the laser light generator to change the frequency of the laser light within a predetermined range, the frequency locker additionally configured to detect an amplitude corresponding to a saturated absorption line occurring in the differential signal, and further configured to stabilize the frequency of the laser light to a predetermined value; and
   an error detector configured to output a first error signal when the amplitude corresponding to the saturated absorption line occurring in the differential signal is greater than a predetermined value.

2. The laser apparatus according to claim 1 further comprising a drive status controller configured to control initiation and suspension of frequency stabilizing control of the laser light by the frequency locker in response to an input drive status control signal.

3. The laser apparatus according to claim 2 further comprising a suspension determiner configured to output the drive status control signal to the drive status controller in a case where the first error signal has been output, the drive status control signal being output so as to suspend the frequency stabilizing control of the laser light by the frequency locker.

4. The laser apparatus according to claim 3 further comprising a laser drive controller configured to control an optical intensity of the laser light emitted from the laser light generator in response to a second light output signal, wherein:
   the laser light detector photoelectrically converts the laser light and outputs the second light output signal, and
   the drive status controller controls initiation and suspension of optical intensity control of the laser light by the laser drive controller in response to the drive status control signal.

5. The laser apparatus according to claim 4, wherein:
   the laser light generator comprises a laser as a light source, and
   the laser drive controller supplies drive current to the laser based on the second light output signal.

6. The laser apparatus according to claim 5, wherein the error detector outputs a second error signal when the drive current is greater than a predetermined value.

7. The laser apparatus according to claim 6, wherein the suspension determiner outputs the drive status control signal to the drive status controller when the second error signal has been output, the drive status control signal being output so as to suspend the frequency stabilizing control of the laser light by the frequency locker and suspend the optical intensity control of the laser light by the laser drive controller.

8. The laser apparatus according to claim 7, wherein the suspension determiner outputs the drive status control signal to the drive status controller when the first error signal and the second error signal have not been output due to a reset, the drive status control signal being output so as to initiate the frequency stabilizing control of the laser light by the frequency locker and initiate the optical intensity control of the laser light by the laser drive controller.

9. The laser apparatus according to claim 8 further comprising an error resetter configured to execute a reset operation causing the error detector to reset the first error signal in when the first error signal has been input and an error reset denial signal has not been input.

10. The laser apparatus according to claim 9, wherein when the first error signal is output from the error detector after the reset operation has been performed a predetermined number of times, the error resetter does not execute the reset operation.

* * * * *